United States Patent
Yanai et al.

(10) Patent No.: US 8,759,177 B2
(45) Date of Patent: Jun. 24, 2014

(54) PATTERN FORMING METHOD

(75) Inventors: Yoshihiro Yanai, Mie (JP); Koichi Matsuno, Mie (JP); Seiro Miyoshi, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 123 days.

(21) Appl. No.: 13/601,003

(22) Filed: Aug. 31, 2012

(65) Prior Publication Data

US 2013/0157437 A1 Jun. 20, 2013

(30) Foreign Application Priority Data

Dec. 19, 2011 (JP) ................................. 2011-277247

(51) Int. Cl.
*H01L 21/8247* (2006.01)

(52) U.S. Cl.
USPC .................................. 438/257; 257/E21.179

(58) Field of Classification Search
CPC ............ H01L 21/0274; H01L 21/0337; H01L 21/28123; H01L 21/32139; H01L 27/115; H01L 29/788; H01L 29/792
USPC ........................... 438/257–267; 257/E21.179
See application file for complete search history.

(56) References Cited

U.S. PATENT DOCUMENTS

| 7,604,926 | B2 | 10/2009 | Kamigaki et al. |
| 7,669,172 | B2 | 2/2010 | Ito et al. |
| 7,737,041 | B2 | 6/2010 | Kito et al. |
| 8,158,333 | B2 | 4/2012 | Hashimoto |
| 2009/0162795 | A1 | 6/2009 | Lee et al. |
| 2010/0219538 | A1 | 9/2010 | Kito et al. |
| 2010/0221665 | A1 | 9/2010 | Hashimoto |

FOREIGN PATENT DOCUMENTS

| JP | 2006-303022 A | 11/2006 |
| JP | 2007-305970 A | 11/2007 |
| JP | 2008-233383 A | 10/2008 |
| JP | 2008-258360 A | 10/2008 |
| JP | 2010-284921 A | 12/2010 |
| JP | 2011-134855 A | 7/2011 |

*Primary Examiner* — Richard Booth
(74) *Attorney, Agent, or Firm* — Oblon, Spivak, McClelland, Maier & Neustadt, L.L.P.

(57) ABSTRACT

According to one embodiment, firstly, an inversion pattern having a periodic pattern in which a first line pattern and a space are inversed and a non-periodic pattern arranged at an interval which is substantially equal to the width of the first line pattern from the end of the periodic pattern is formed above a processing object so as to correspond to the plurality of spaces between a plurality of first line patterns in a first pattern and the space between the first pattern and a second pattern. Next, a sidewall film is formed around the inversion pattern, and the periodic pattern is removed selectively. Thereafter, the processing object is etched using the sidewall pattern formed of the sidewall film and the non-periodic pattern surrounded by the sidewall film as masks.

20 Claims, 12 Drawing Sheets

CHANGE IN EXPOSURE
AMOUNT

CHANGE IN EXPOSURE
AMOUNT

PATTERN FORMING METHOD

CROSS-REFERENCE TO RELATED APPLICATIONS

This application is based upon and claims the benefit of priority from Japanese Patent Application No. 2011-277247, filed on Dec. 19, 2011; the entire contents of which are incorporated herein by reference.

FIELD

Embodiments described herein relate generally to a pattern forming method.

BACKGROUND

Due to a miniaturization of a semiconductor device, it is difficult to form a line and space pattern having a width that is below the resolution limit of lithography. In order to resolve that problem, a sidewall transferring process has been suggested.

In the related art, using the sidewall transferring process, a NAND type flash memory is manufactured by a method which will be described below. First, on a processing target film in which a tunnel insulating film, a floating gate electrode film, an inter-electrode insulating film, and a control gate electrode film are stacked on a semiconductor substrate, a mask film and a hard mask film are stacked. Next, a resist pattern for forming selection gate lines or peripheral circuits is formed on the hard mask film using a general photolithography technique and the hard mask film is etched using the resist pattern as a mask by an RIE (reactive ion etching) method and a hard mask pattern is formed. Thereafter, in a word line forming region, a line and space shaped resist pattern having a first interval is formed on the mask film using a general photolithography technique. After slimming the resist pattern, the mask film is etched using the resist pattern and the hard mask pattern as masks by the RIE method to form the mask pattern. Continuously, after conformally forming and etching back the sidewall film on the processing target film on which the mask pattern is formed, the mask pattern in the word line forming region is removed to form a closed loop shaped sidewall pattern. In the word line forming region, the processing target film is processed using the closed loop shaped sidewall pattern. In the other region than the word line forming region, the processing target film is processed using the mask pattern. By doing this, the word lines, the selection gate lines, and the peripheral circuits of the NAND type flash memory are formed.

As described above, according to the photolithography technique in the related art, it is difficult to simultaneously expose a fine pattern and a comparatively large sized pattern. Therefore, a line and space shaped pattern for forming word lines of which size is the smallest on the semiconductor device is formed using a different exposure process from a pattern for selection gate lines or peripheral circuits of which sizes are larger than that of the line and space shaped pattern.

In the above-mentioned NAND type flash memory, it is ideal to make a gap between a pattern at an end of the word lines and a pattern of the selection gate line adjacent thereto to be a gap as small as a gap between the word lines. However, it is difficult to reduce the gap to be as small as the gap between the word lines because alignment is required during the photolithography.

DETAILED DESCRIPTION

According to exemplary embodiments, first, a pattern in which a first pattern in which a plurality of first line patterns extending in a first direction are arranged in a second direction orthogonal to the first direction and a second pattern arranged so as to be spaced apart from an end in the second direction of the first pattern with a space at a predetermined interval therebetween are mixed is formed above a processing object. Thereafter, an inversion pattern having a periodic pattern in which the first line patterns of the first pattern and spaces therebetween are inverted and a non-periodic pattern that is arranged at an interval which is substantially equal to a width of the first line patterns from an end in the second direction of the periodic pattern is formed above the processing object so as to correspond to the spaces between the first line patterns in the first pattern and the space between the first pattern and the second pattern, respectively. Next, a sidewall film is conformally formed above the processing object above which the inversion pattern is formed and the sidewall film is etched back so as to expose a top surface of the inversion pattern. The periodic pattern is selectively removed among the inversion pattern of which top surface is exposed and a sidewall pattern that is formed of the sidewall film above the processing object is formed. The processing object is etched using the sidewall pattern and the non-periodic pattern surrounded by the sidewall film as masks.

Hereinafter, referring to accompanying drawings, the pattern forming method according to exemplary embodiments will be described in detail. However, the exemplary embodiments are not intended to limit the scope of the invention. Further, cross-sectional views of a non-volatile semiconductor memory device used in the exemplary embodiments which will be described below are schematically illustrated. Therefore, the relationship between a thickness and a width of a layer or a ratio of thicknesses of layers may be different from actual values. The thickness of the films is illustrative, but the invention is not limited thereto.

First Embodiment

Hereinafter, it is described that exemplary embodiments are applied to a NAND type flash memory device as a non-volatile semiconductor memory device. The NAND type flash memory device includes a memory cell region in which a plurality of memory cell transistors (hereinafter, referred to as memory cells) are arranged in a matrix and a peripheral circuit region having peripheral circuit transistors that drive the memory cells.

Figure 1:
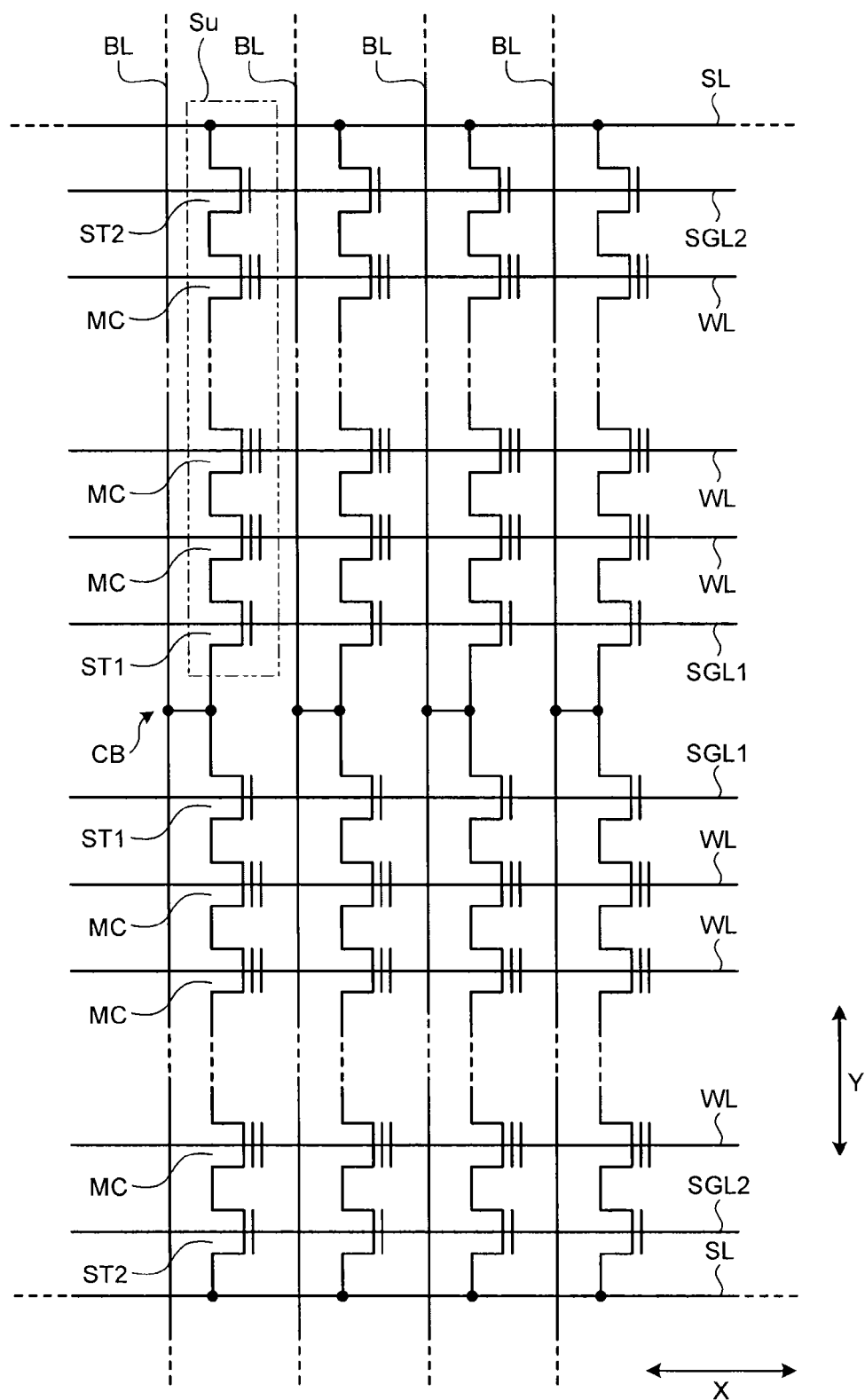
FIG. 1 is an equivalent circuit diagram illustrating some of memory cell arrays formed in a memory cell region of a NAND type flash memory device.

FIG. 1 is an equivalent circuit diagram illustrating some of the memory cell arrays formed in the memory cell region of the NAND type flash memory device. The memory cell array of the NAND type flash memory device is configured by arranging NAND cell units (memory units) Su formed of two selection gate transistors ST1 and ST2 and a memory cell row in which a plurality (for example, $2^n$ (n is a positive integer) of memory cells MC are connected in series between the selection gate transistors ST1 and ST2 in a matrix. In the NAND cell unit Su, the plurality of memory cells MC are formed so as to share a source/drain region by adjacent memory cells.

The memory cells MC arranged in an X direction (corresponding to a word line direction and a gate width direction) in FIG. 1 are commonly connected by word lines (control gate line) WL. Further, the selection gate transistors ST1 arranged in the X direction in FIG. 1 are commonly connected by a selection gate line SGL1 and the selection gate transistors ST2 are commonly connected by a selection gate line SGL2. A bit line contact CB is connected to a drain region of the selection gate transistor ST1. An end of the bit line contact CB is connected to a bit line BL extending in a Y direction (corresponding to a bit line direction and a gate length direction) orthogonal to the X direction in FIG. 1. Further, the selection gate transistor ST2 is connected to a source line SL extending in the X direction in FIG. 1 through a source region.

Figure 2:
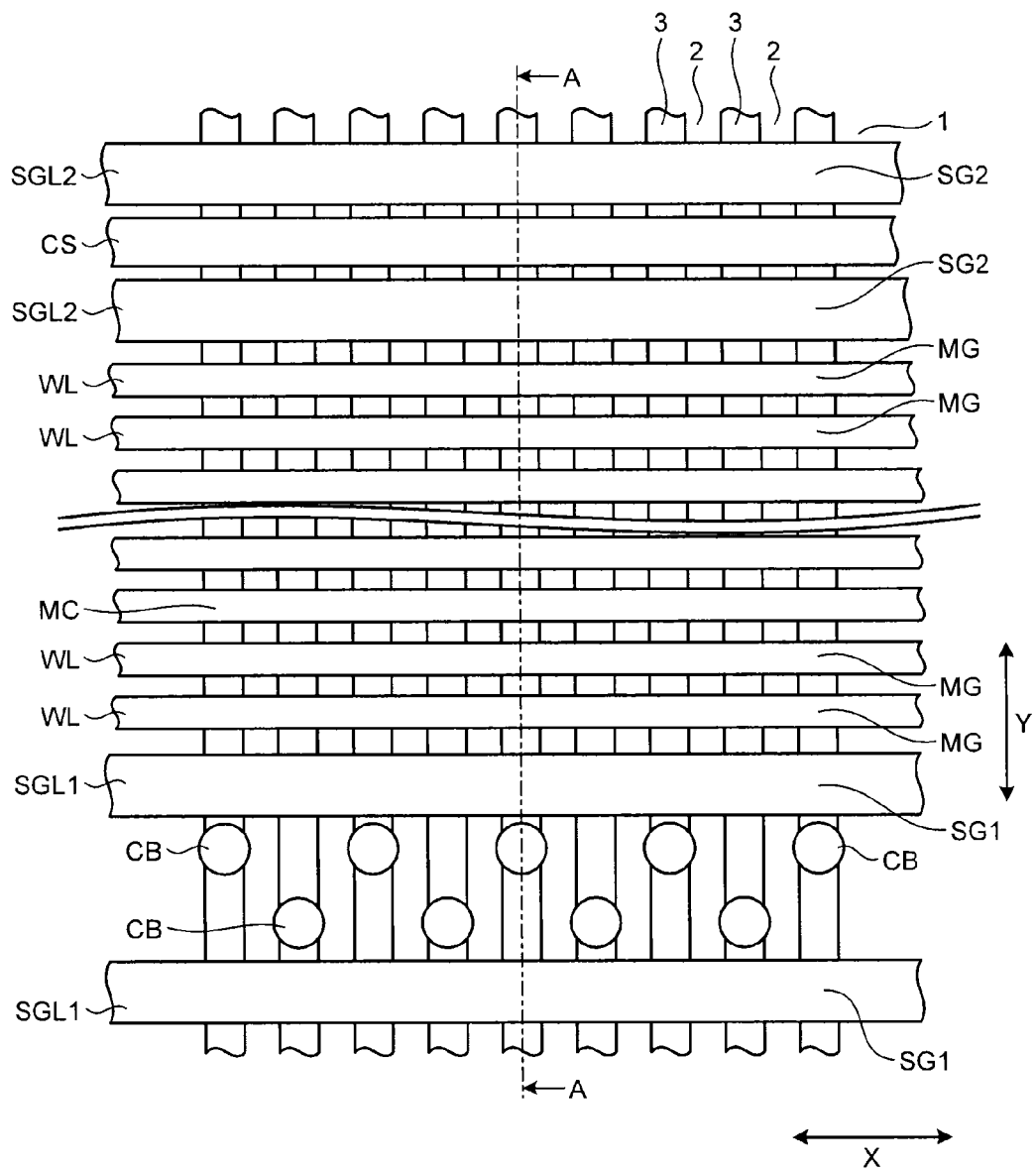
FIG. 2 is a plan view illustrating a layout pattern of a part of the memory cell region.

FIG. 2 is a plan view illustrating a layout pattern of a part of the memory cell region. On a semiconductor substrate 1, a plurality of STIs (shallow trench isolations) 2 as element isolation regions extend in a Y direction in FIG. 2 and are arranged at a predetermined interval in an X direction. Therefore, activated areas 3 adjacent to the STIs are isolated in the X direction in FIG. 2. Word lines WL of the memory cell MC are formed so as to extend in the X direction in FIG. 2 which is orthogonal to the activated areas 3 at a predetermined interval in the Y direction.

Further, two selection gate lines SGL1 extending in the X direction in FIG. 2 are formed in parallel so as to be adjacent to each other. In the activated areas 3 between adjacent two selection gate lines SGL1, bit line contacts CB are formed, respectively. In this embodiment, the bit line contacts CB are arranged so as to alternately vary the positions of the Y direction in the adjacent activated areas 3. In other words, between the two selection gate lines SGL1, bit line contacts CB which are arranged closely to one selection gate line SGL1 and bit line contacts CB which are arranged closely to the other selection gate line SGL1 are alternately arranged in a zigzag pattern.

In a position where the selection gate line SGL1 and a predetermined number of word lines WL are present, two selection gate lines SGL2 extending in the X direction in FIG. 2 are formed in parallel, which is similar to the selection gate line SGL1. In the activated area 3 between the two selection gate lines SGL2, source line contacts CS are disposed.

A stacked gate structure MG of the memory cell MC is formed on the activated area 3 intersecting the word lines WL and gate structures SG1 and SG2 of the selection gate transistors ST1 and ST2 are formed on the activated area 3 intersecting the selection gate lines SGL1 and SGL2.

Figure 3:
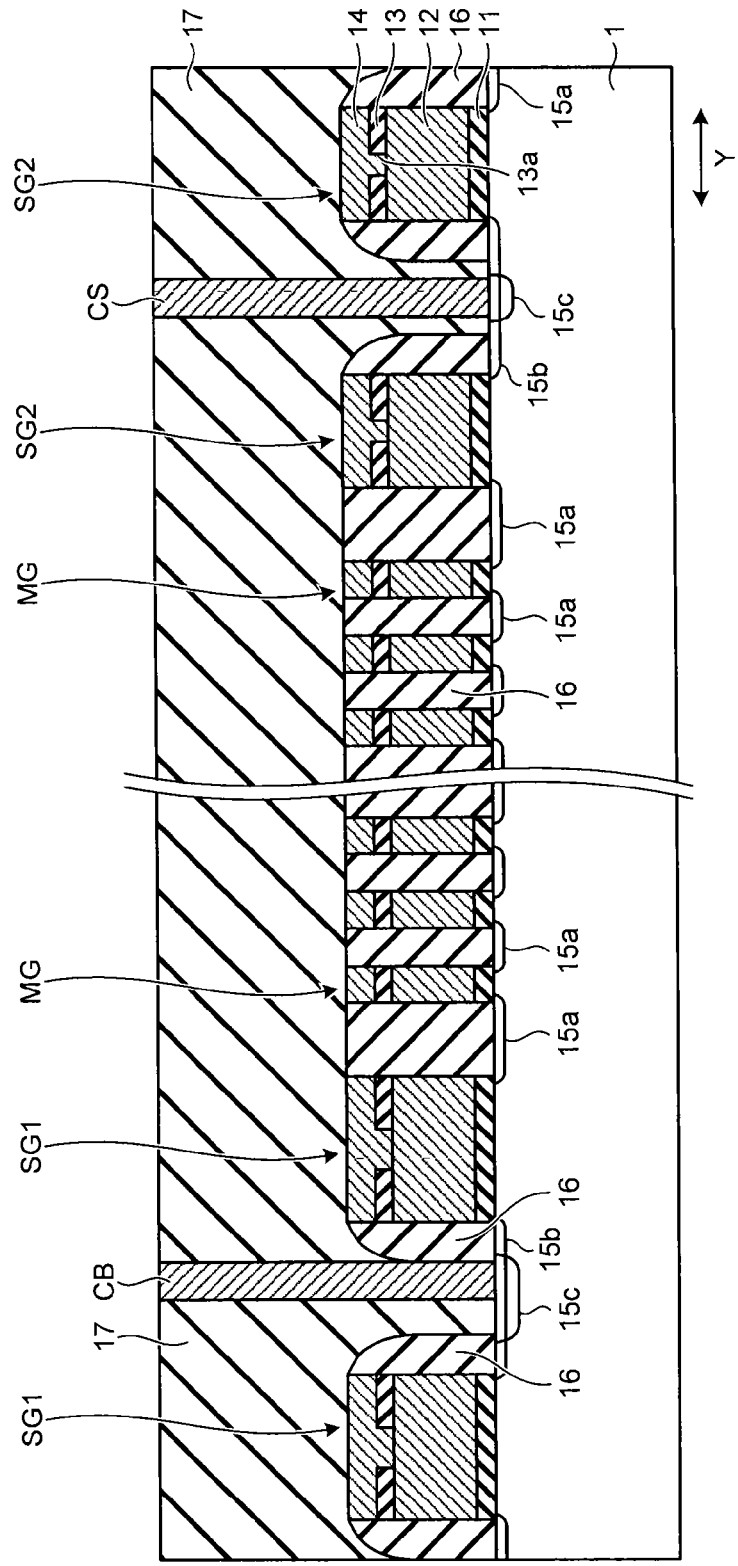
FIG. 3 is a cross-sectional view taken along line A-A of FIG. 2.

FIG. 3 is a cross-sectional view taken along line A-A of FIG. 2. In other words, FIG. 3 illustrates the gate structures SG1 and SG2 of the selection gate transistors ST1 and ST2 in the activated area 3 and the stacked gate structure MG of the memory cells MC arranged between the two selection gate transistors ST1 and ST2. In FIG. 3, the stacked gate structure MG of the memory cells MC and the gate structures SG1 and SG2 of the selection gate transistors ST1 and ST2 formed on the semiconductor substrate 1 such as a silicon substrate have a structure in which a floating gate electrode film 12, an inter-electrode insulating film 13, and a control gate electrode film 14 are sequentially stacked through a tunnel insulating film 11. Further, an opening 13a is formed in the inter-electrode insulating film 13 of each of the gate structures SG1 and SG2 of the selection gate transistors ST1 and ST2 so as to allow the floating gate electrode film 12 and the control gate electrode film 14 to be conducted with each other. The control gate electrode film 14 is embedded in the opening 13a. By doing this, a gate electrode is configured by the floating gate electrode film 12 and the control gate electrode film 14 in the selection gate transistors ST1 and ST2.

As the tunnel insulating film 11, a thermal oxide film or a thermal oxide nitride film, a CVD (chemical vapor deposition) oxide film or a CVD oxide nitride film, an insulating film with Si being interposed, an insulating film with Si being embedded in a dot shape, or the like may be used. As the floating gate electrode film 12, a polycrystalline silicon doped with N-type impurities or P type impurities, a metal film or a polymetal film using Mo, Ti, W, Al or Ta, or the like or a nitride film, or the like may be used. As the inter-electrode insulating film 13, a silicon oxide film, a silicon nitride film, an ONO (oxide-nitride-oxide) film having a stacked structure of a silicon oxide film and a silicon nitride film, a high dielectric film such as an aluminum oxide film or a hafnium oxide film, or a stacked structure of a low dielectric film such as a silicon oxide film or a silicon nitride film and the high dielectric film may be used. As the control gate electrode film 14, a polycrystalline silicon doped with N-type impurities or P type impurities, a metal film or a polymetal film using Mo, Ti, W, Al or Ta, or the like, a stacked structure of a polycrystalline silicon film and a metal silicide film, or the like may be used.

An impurity diffusion region 15a which serves as a source/drain region is formed near a surface of the semiconductor substrate 1 between the stacked gate structures MG and MG and between the stacked gate structure MG and the gate structures SG1 and SG2. Further, an impurity diffusion region 15b which serves as a source/drain region similarly to the impurity diffusion region 15a is formed near the surface of the semiconductor substrate 1 between the adjacent gate structures SG1-SG1 and SG2-SG2.

On sidewall surfaces between a pair of adjacent stacked gate structures MG and MG, the stacked gate structure MG and the gate structures SG1 and SG2, and the gate structures SG1-SG1 and SG2-SG2, sidewall insulating films 16 formed of, for example, a silicon oxide film are formed. Here, between the stacked gate structures MG and MG and between the stacked gate structure MG and the gate structures SG and SG2, the sidewall insulating film 16 is formed so as to be embedded. However, between the gate structures SG1-SG1 and SG2-SG2, the sidewall insulating film 16 is not totally embedded, but the sidewall insulating film 16 is formed to be provided on opposing sidewall surfaces.

Near the surface of the semiconductor substrate 1 between opposing sidewall insulating films 16 between the gate structures SG1-SG1 and SG2-SG2, impurity diffusion regions 15c that lower a contact resistance of the bit line contacts CB and the source line contacts CS are formed. The impurity diffusion region 15c is formed such that the width size is narrower and the diffusion depth (depth of pn junction) is deeper than those of the impurity region 15b, so that an LDD (lightly doped drain) structure is formed.

Further, on the stacked gate structure MG and on the gate structures SG1 and SG2 on which the side wall insulating film 16 is formed, an interlayer insulating film 17 is formed. Between the adjacent gate structures SG1-SG1 arranged at one end of the memory cell MC row, the bit line contacts CB that reach the surface of the semiconductor substrate 1 from the top surface of the interlayer insulating film 17 are formed. As described above, the bit line contacts CB are alternately arranged in a zigzag pattern when viewed in plan view. In FIG. 3, the bit line contacts CB are formed to be close to the right side. Further, between the adjacent gate structures SG2-SG2 arranged at the other end of the memory cell MC row, the source line contacts CS that reach the surface of the semiconductor substrate 1 from the top surface of the interlayer insulating film 17 are formed so as to traverse below the bit line BL.

Figure 4A:
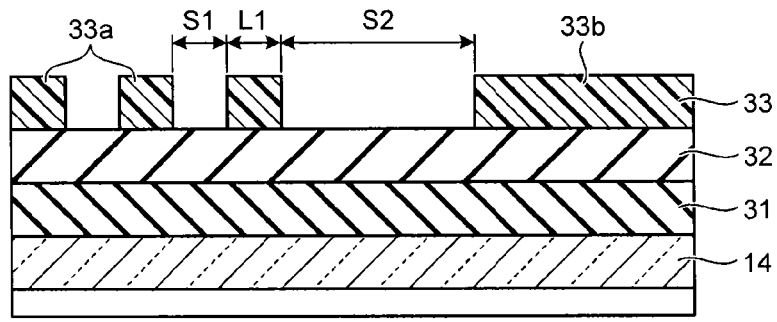
FIGS. 4A to 4N are partial cross-sectional views schematically illustrating an example of a pattern forming method according to a first embodiment.

Next, a pattern forming method will be described using an example in which a NAND type flash memory device is formed. FIGS. 4A to 4N are partial cross-sectional views schematically illustrating an example of a pattern forming method according to the first embodiment. Here, a partial region in which the selection gate lines SGL1 and SGL2 (hereinafter, referred to SGL) and the word lines WL of one memory unit Su are arranged is illustrated in FIGS. 4A to 4N.

First, on the semiconductor substrate 1 such as a predetermined conductive type silicon substrate, the tunnel insulating film 11 and the floating gate electrode film 12 are formed and trenches that reach the semiconductor substrate 1 are formed by a photolithography technique and an etching technique such as an RIE method. The trenches are formed so as to extend in a Y direction (bit line direction) at a predetermined interval in an X direction (word line direction). Subsequently, an insulating film such as silicon oxide film is embedded in the trench to form ST12. Thereafter, the inter-electrode insulating film 13 is formed above the entire surface of the semiconductor substrate 1 and an opening that passes through the inter-electrode insulating film 13 is formed in a forming region of the selection gate line SGL using a photolithography technique and an etching technique. The control gate electrode film 14 is formed above the entire surface of the semiconductor substrate 1. The processing objects are the tunnel insulating film 11, the floating gate electrode film 12, the inter-electrode insulating film 13, and the control gate electrode film 14 which are formed on the semiconductor substrate 1. However, in the following drawings, the control gate electrode film 14 which is located on the uppermost layer is illustrated and described as the processing object. Further, Si is used for the control gate electrode film 14. A hard mask film may be further stacked on the control gate electrode film 14 formed of Si, the hard mask film is processed to have a pattern shape of the word lines WL or the selection gate lines SL, and then the pattern of the hard mask film may be transferred onto the control gate electrode film 14.

Next, as illustrated in FIG. 4A, on the entire surface of the processing object (control gate electrode film 14), a core film 31 and a mask film 32 are sequentially stacked. For example, TEOS (tetraethoxysilane) film may be used as the core film 31 and a SiN film is used as the mask film 32. A resist is applied on the mask film 32 and using the lithography technique, a resist pattern 33 is formed to be patterned so as to have a line and space shaped pattern (periodic pattern) 33a in which line patterns extending in an X direction are arranged in a Y direction at a predetermined interval and an independent pattern (non-periodic pattern) 33b that is adjacent to the end in the Y direction of the periodic pattern 33a.

Here, a width in the Y direction of the line pattern that forms the periodic pattern 33a is L1, a width of a space between the line patterns is S1, and a width of a space between the pattern at the end in the Y direction of the periodic pattern 33a and the non-periodic pattern 33b is S2. When the non-periodic pattern 33b is formed using a lithography technique so as to be adjacent to the pattern at the end of the periodic pattern 33a, it is difficult to adjust the space S2 between the end of the periodic pattern 33a and the non-periodic pattern 33b to be smaller than a predetermined value determined by the value of the width L1 in the Y direction of the line pattern or the space S1 that form the periodic pattern 33a. Therefore, the space S2 is larger than the space S1.

Figure 4B:
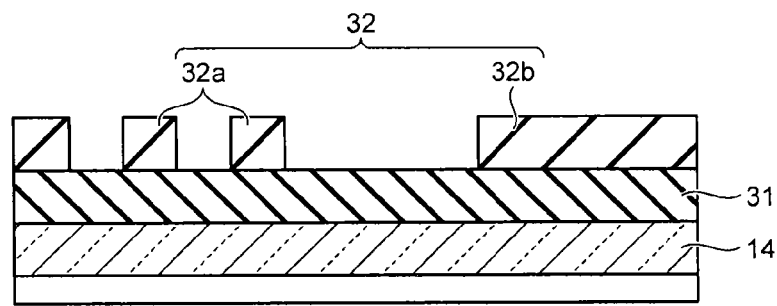

Thereafter, as illustrated in FIG. 4B, the mask film 32 is processed using the resist pattern 33 as a mask by anisotropic etching such as an RIE method and the resist pattern 33 is transferred thereon. By doing this, in the mask film 32, a periodic pattern (first pattern) 32a in which line patterns having a width of L1 in the Y direction are arranged with the space S1 in the Y direction and a non-periodic pattern (second pattern) 32b formed to be spaced apart from the end in the Y direction of the periodic pattern 32a with the space S2 therebetween are formed. After completing the processing, the resist pattern 33 is removed by a resist stripping technique.

Figure 4C:
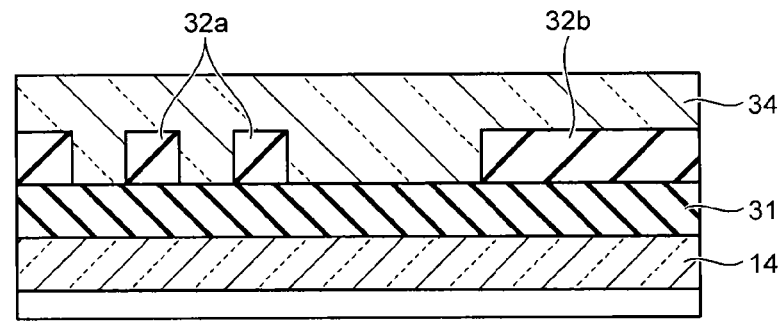
Figure 4D:
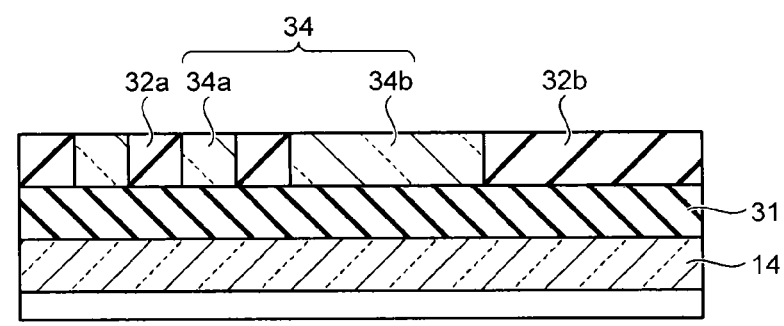

Next, as illustrated in FIG. 4C, the spaces S1 and S2 are embedded and an inversion layer 34 is formed on the entire surface of the processing object so as to be higher than the top surface of the mask film 32. For example, Si may be used for the inversion layer 34. Thereafter, as illustrated in FIG. 4D, the entire surface of the inversion layer 34 is etched until the top surface of the mask film 32 is exposed. By doing this, the inversion layer 34 becomes a periodic pattern 34a formed in a region of the space S1 of the periodic pattern 32a, and a non-periodic pattern 34b formed in a region of the space S2.

Figure 4E:
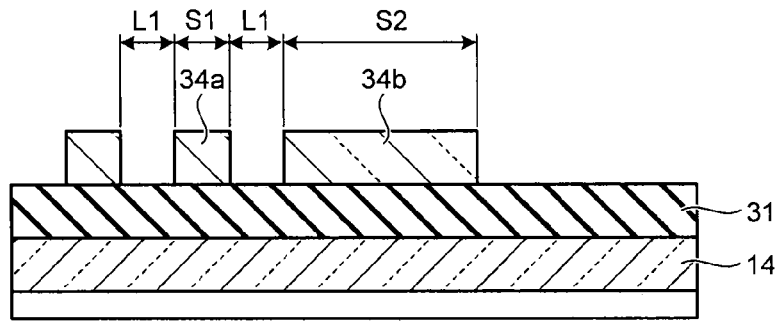

Further, as illustrated in FIG. 4E, the mask film 32 is selectively removed by etching. By doing this, the periodic pattern 34a and the non-periodic pattern 34b formed of the inversion layer 34 are formed in a position of the space S1 of the periodic pattern 33a formed in FIG. 4A and a position of the space S2 between the periodic pattern 33a and the non-periodic pattern 33b. A width in the Y direction of the line pattern that forms the periodic pattern 34a is substantially equal to S1 and the width of the space is substantially equal to L1. A width in the Y direction of the non-periodic pattern 34b is substantially equal to S2 and the interval between the non-periodic pattern 34b and the periodic pattern 34a is substantially L1. The periodic pattern 34a and the non-periodic pattern 34b serve as an inversion mask pattern for etching the core film 31. After forming a resist pattern 33 in which the periodic pattern (first pattern) 33a and the non-periodic pattern (second pattern) 33b are mixed without using the mask film 32 on the core film 31, the periodic pattern 34a and the non-periodic pattern 34b formed of the inversion layer 34 may be directly formed in the positions of the spaces S1 and S2 in the resist pattern 33 by the procedures same as illustrated in FIGS. 4C to 4E to be served as the inversion mask pattern.

Figure 4F:
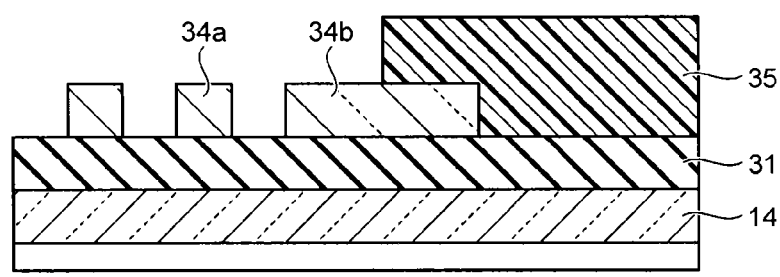

Thereafter, as illustrated in FIG. 4F, a resist is applied on the core film 31 in which the periodic pattern 34a and the non-periodic pattern 34b are formed and patterning is formed by a lithography technique so as to cover a region where the non-periodic pattern (second pattern) 32b of the mask film 32 is removed and expose the region of the periodic pattern 34a to form the resist pattern 35. By loading a pattern end of the resist pattern 35 on the non-periodic pattern 34b which is a wide pattern, an alignment margin becomes wider, which allows a lower grade exposure device to be used.

Figure 4G:
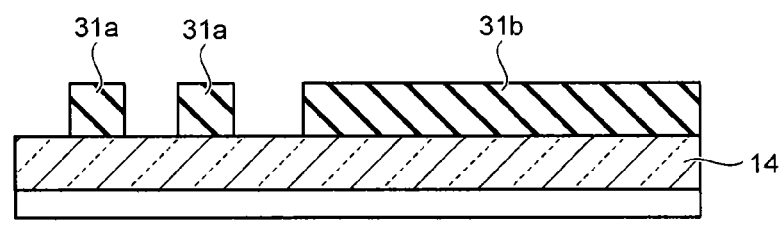

Next, as illustrated in FIG. 4G, the periodic pattern 34a, the non-periodic pattern 34b, and the resist pattern 35 are used as masks to process the core film 31 by anisotropic etching such as the RIE method. By doing this, the line and space shaped periodic pattern 31a and the non-periodic pattern 31b that is adjacent to the end in the Y direction of the periodic pattern 31a are formed in the core film 31. The periodic pattern 31a and the non-periodic pattern 31b become inversion patterns to be arranged on the processing object. Thereafter, the resist pattern 35 is removed by the resist stripping technique.

Figure 4H:
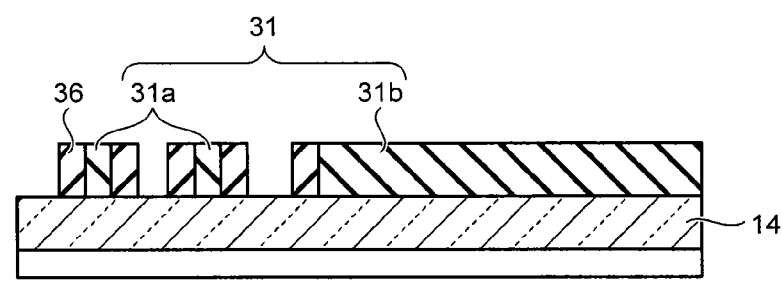

Next, as illustrated in FIG. 4H, by slimming the periodic pattern 31a by isotropic etching until a width of the line pattern that forms the periodic pattern 31a becomes to be substantially half of the width, the sidewall film is formed on the entire surface of the processing object in which the slimmed inversion pattern is formed to have a thickness which is substantially equal to the width of the line pattern that forms the slimmed periodic pattern 31a. Further, the formed sidewall film is etched back until the top surface of the core film 31 that forms the slimmed inversion pattern is exposed. By doing this, loop shaped sidewall patterns 36 having a width which is substantially equal to that of the line pattern that forms the periodic pattern 31a are formed around the periodic pattern 31a and the non-periodic pattern 31b.

Figure 4I:
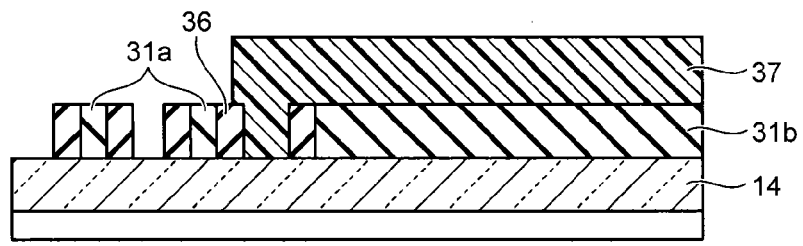

Thereafter, as illustrated in FIG. 4I, a resist is applied above the entire surface of the processing object and patterned by the lithography technique so as not to cover the periodic pattern 31a in a region where the word line WL is formed to form a resist pattern 37.

Figure 4J:
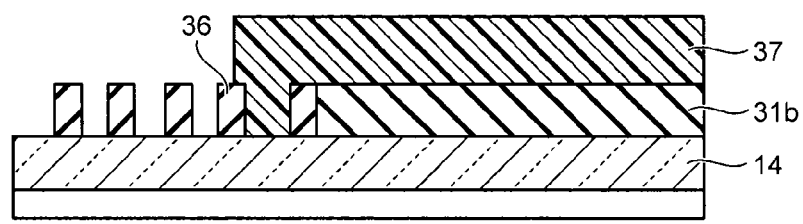
Figure 4K:
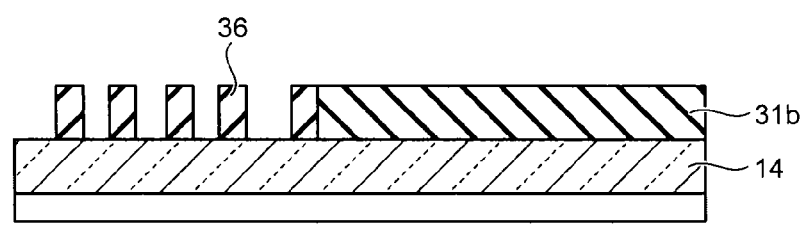

Next, as illustrated in FIG. 4J, the periodic pattern 31a of the inversion pattern is selectively removed by wet etching. As illustrated in FIG. 4K, the resist pattern 37 is removed by the resist stripping technique. By doing this, in a word line WL forming region, the periodic pattern 31a is removed and the sidewall patterns 36 remain. Further, in a selection gate line SGL forming region, the non-periodic pattern 31b around which the sidewall pattern 36 is formed remains.

Figure 4L:
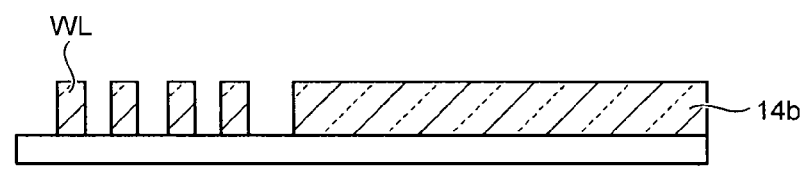

Thereafter, as illustrated in FIG. 4L, using the remaining sidewall patterns 36 and non-periodic pattern 31b as masks, the processing object is processed by the anisotropic etching such as the RIE method. By doing this, in the word line WL forming region, loop shaped word lines WL are formed. Further, in a region including the selection gate line SGL forming region, the non-periodic pattern 14b which has a width larger than the width of the selection gate line SGL is formed. Thereafter, the sidewall patterns 36 and the non-periodic pattern 31b which are used as masks are removed by wet etching.

Figure 4M:
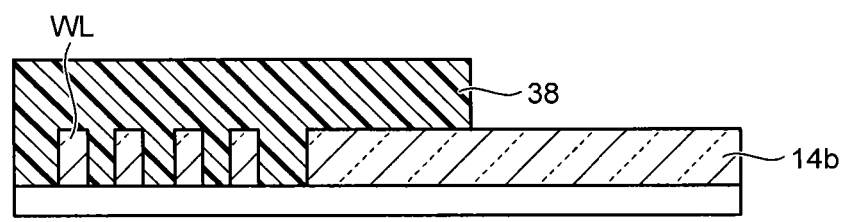
Figure 4N:
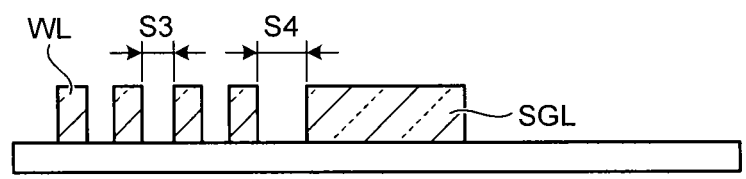

Next, as illustrated in FIG. 4M, a resist is applied on the entire surface of the processing object and a resist pattern 38 that is patterned so as to cover the word line WL forming region and the selection gate line SGL forming region is formed by the lithography technique. Here, even though the non-periodic pattern 14b is partially covered with the resist pattern 38, the covered portion is a portion to become the selection gate line SGL.

As illustrated in FIG. 4N, the processing object is etched using the resist pattern 38 as a mask by anisotropic etching such as the RIE method. In this case, the word line WL which is a periodic pattern is covered with the resist pattern 38 and a part of the non-periodic pattern 14b is exposed. Therefore, it is possible to perform etching under the condition that the control gate electrode film 14 which constitutes the non-periodic pattern 14b is processed. Therefore, when etching is performed around a boundary of the semiconductor substrate 1 below the non-periodic pattern 14b (control gate electrode film 14), it is possible to control the etching condition so that no strong damage remains on the semiconductor substrate 1.

As described above, a NAND type flash memory device in which word lines WL having a line width which is substantially half of the space S1 of FIG. 4A are periodically arranged in a space S3 having a width which is substantially half of the width L1 of the line pattern in the periodic pattern 33a of FIG. 4A in the Y direction, the space between the word line WL and the selection gate line SGL is significantly smaller than the space S2, and a space S4 has a width which is substantially approximate to the width of the space S3 is formed. In other words, the distance S3 between adjacent word lines WL may be substantially equal to the distance S4 between adjacent word line WL and selection gate line SGL. Since the formed gate line WL has a loop shape, a loop-cut processing which removes a connection part between the adjacent word lines WL near the end in an extending direction of the word line WL is performed. The loop-cut processing may be performed later than the above-mentioned processings. Further, when a mask for forming the selection gate line SGL of FIG. 4M is formed to etch the non-periodic pattern 14b, the loop-cut processing for the word line WL may be simultaneously performed.

In the first embodiment, after forming the line and space shaped periodic pattern 32a and the non-periodic pattern 32b that is disposed so as to be adjacent to the periodic pattern 32a in the mask film 32, the inversion layer 34 is formed so as to be embedded between the patterns and the mask film 32 is removed to form an inversion mask pattern. By doing this, a space and a line pattern in the periodic pattern 32a which is first formed become a line pattern and a space of the periodic pattern 34a formed by the inversion layer 34, respectively. The space between the periodic pattern 34a and the non-periodic pattern 34b formed by the inversion layer 34 becomes a position of the line pattern in the first formed periodic pattern 32a. Therefore, the distance between the periodic pattern 34a and the non-periodic pattern 34b can be shortened.

After processing the core film 31 with the inversion mask pattern, a mask for forming the word line WL and the selection gate line SGL is formed using a sidewall transferring process and the processing object is processed to form the word line WL and the selection gate line SGL. By doing this, the distance S4 between the word line WL and the selection gate line SGL is adjusted to have a value close to the distance S3 between adjacent word lines WL. As a result, a chip area of the NAND type flash memory device can be reduced as compared with the related art. Further, in the lithography technique which is used after forming the inversion layer 34, it is possible to use an exposure device which does not require a high adjustment precision, which reduces the manufacturing cost of the non-volatile semiconductor memory device.

Second Embodiment

FIGS. 5A to 5H are partial cross-sectional views schematically illustrating an example of a pattern forming method according to a second embodiment. Here, similarly, a part of a region in which selection gate lines SGL and word lines WL of one memory unit Su are arranged is illustrated.

Figure 5A:
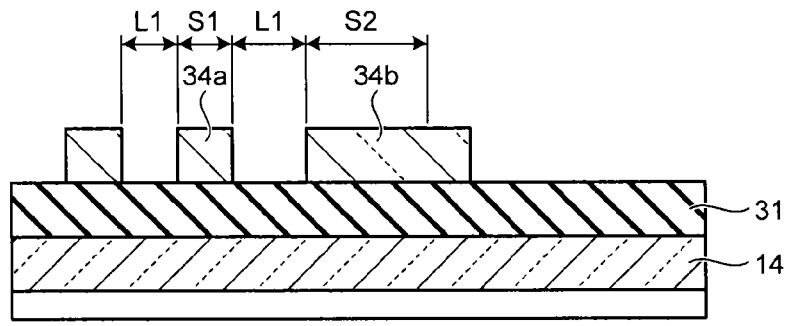
FIGS. 5A to 5H are partial cross-sectional views schematically illustrating an example of a pattern forming method according to a second embodiment.

First, by the same procedures as illustrated in FIGS. 4A to 4E of the first embodiment, an inversion layer 34 is formed so as to be embedded between line patterns that form a periodic pattern 32a formed of a mask film 32 and between the periodic pattern 32a and a non-periodic pattern 32b and the entire surface of the inversion layer 34 is etched until the top surface of the mask film 32 is exposed. Thereafter, as illustrated in FIG. 5A, the mask film 34 is selectively removed by etching. By doing this, a periodic pattern 34a and a non-periodic pattern 34b formed of the inversion layer 34 are formed in a position of a space S1 in the periodic pattern 33a which is formed in FIG. 4A and a position of a space S2 between the periodic pattern 33a and the non-periodic pattern 33b. Alternatively, the periodic pattern 34a and the non-periodic pattern 34b formed on the inversion layer 34 are directly formed in the positions of the spaces S1 and S2 in the resist pattern 33 without forming the mask film 32. The width in the Y direction of the line pattern that forms the periodic pattern 34a is substantially equal to S1 and the width of the space is substantially equal to L1. Further, the width in the Y direction of the non-periodic pattern 34b is substantially equal to S2 and the interval between the periodic pattern 34a and the non-periodic pattern 34b is substantially L1.

Figure 5B:
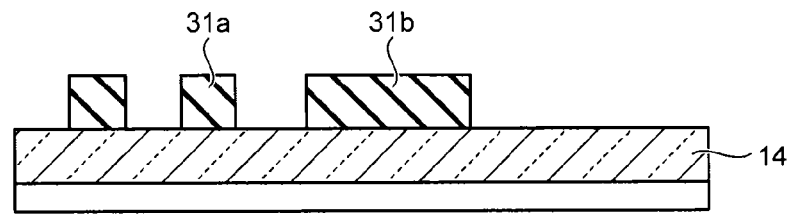

Next, as illustrated in FIG. 5B, the core film 31 is processed using the periodic pattern 34a and the non-periodic pattern 34b formed of the inversion layer 34 as masks by anisotropic etching such as an RIE method. By doing this, a line and space shaped periodic pattern 31a and a non-periodic pattern 31b adjacent to the end in the Y direction of the line and space shaped pattern are formed in the core film 31. The size of the non-periodic pattern 31b in the Y direction is substantially equal to the size of the selection gate line SGL, which is different from the first embodiment.

Figure 5C:
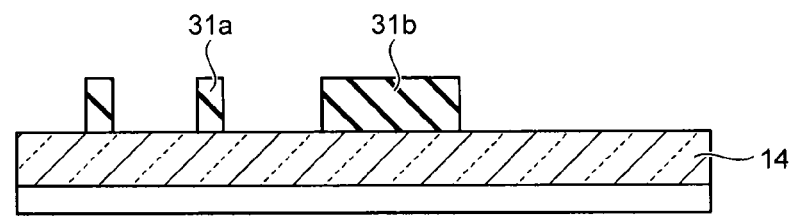
Figure 5D:
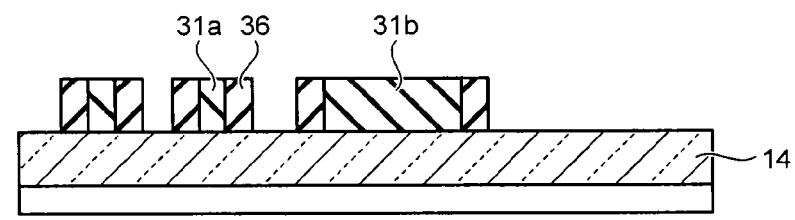

Next, as illustrated in FIG. 5C, the line pattern that forms the periodic pattern 31 is slimmed by isotropic etching until the width of the line pattern is reduced to be substantially half. Thereafter, as illustrated in FIG. 5D, a sidewall film is formed on the entire surface of the processing object in which the periodic pattern 31a and the non-periodic pattern 31b are formed to have a thickness which is substantially equal to the width of the line pattern that forms the slimmed periodic pattern 31a. Further, the formed sidewall film is etched back until the top surfaces of the periodic pattern 31a and the non-periodic pattern 31b are exposed. By doing this, a loop shaped sidewall pattern 36 having a width which is substantially equal to the width of the line pattern that forms the periodic pattern 31a is formed around the periodic pattern 31a and the non-periodic pattern 31b.

Figure 5E:
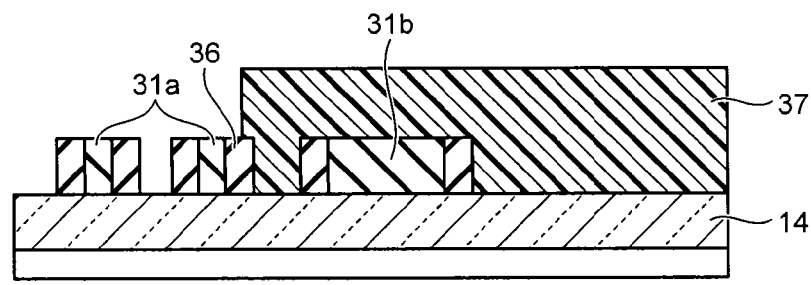

Next, as illustrated in FIG. 5E, a resist is applied on the entire surface of the processing object and patterned by the lithography technique so as not to cover the periodic pattern 31a in a region where the word line WL are formed to form a resist pattern 37.

Figure 5F:
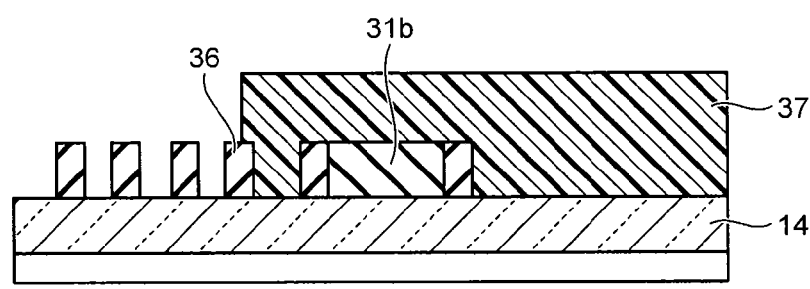
Figure 5G:
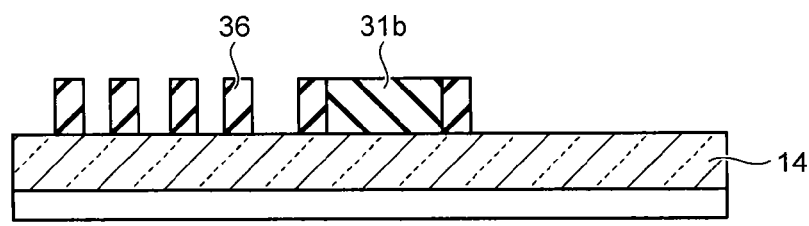

Next, as illustrated in FIG. 5F, the periodic pattern 31a is removed by wet etching. Thereafter, as illustrated in FIG. 5G, the resist pattern 37 is removed by the resist stripping technique. By doing this, in a word line WL forming region, the periodic pattern 31a is removed and the side wall patterns remain, and in a selection gate line SGL forming region, the non-periodic pattern 31b and the side wall pattern 36 formed therearound remain.

Figure 5H:
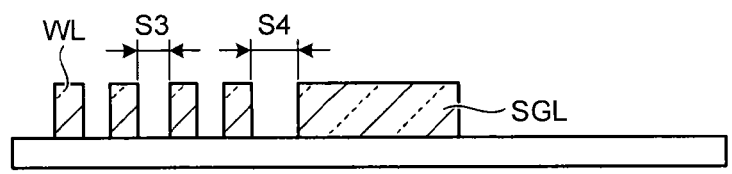

As illustrated in FIG. 5H, using the remaining sidewall pattern 36 and the non-periodic pattern 31b as masks, the processing object is processed by anisotropic etching such as the RIE method. By doing this, a loop shaped word line WL is formed in the word line WL forming region and a selection gate line SGL is formed in the selection gate line SGL forming region. Thereafter, the remaining sidewall patterns 36 and non-periodic pattern 31b are removed by wet etching. Further, a loop-cut processing which removes a connection part between the adjacent word lines WL near the end in an extending direction of the word line WL is performed.

As described above, the NAND type flash memory device in which word lines WL having a line width which is substantially half of the space S1 of FIG. 4A are periodically arranged in a space S3 having a width which is substantially half of the width L1 of the line pattern in the periodic pattern 33a of FIG. 4A in the Y direction and the selection gate line SGL is arranged by placing a space S4 having a width which is approximate to that of the space S3 from the word line WL disposed at the end in the Y direction. In other words, the distance S4 between the adjacent word line WL and selection gate line SGL may be adjusted to be substantially approximate to the distance S3 between the adjacent word lines WL as compared with the related art. Further, in the second embodiment, the forming of the core film 31 is omitted and as an inversion pattern disposed on the processing object, the periodic pattern 34a and the non-periodic pattern 34b which are formed of the inversion layer 34 are directly formed on the processing object so as to correspond to the positions of the spaces S1 and S2 in the resist pattern 33 and the line pattern that forms the periodic pattern 34a is slimmed until the width of the line pattern is reduced to be substantially half. Thereafter, the word line WL and the selection gate line SGL may be formed on the processing object by the same procedures as illustrated in FIGS. 5D to 5H.

According to the second embodiment, the same effect as the first embodiment may be achieved. Further, after processing the core film 31 so as to have a substantially same width as the selection gate line SGL and forming the periodic pattern 31a and the non-periodic pattern 31b, the processing object is processed. Therefore, as compared with the first embodiment, at least one lithography process and etching process may be omitted, which simplifies the processes. Further, when the periodic pattern 34a and the non-periodic pattern 34b formed of the inversion layer 34 are directly formed as the inversion pattern on the processing object while the forming of the core film 31 is omitted, one etching process may be further omitted.

Third Embodiment

FIGS. 6A to 6E are partial cross-sectional views schematically illustrating an example of a pattern forming method according to a third embodiment. Here, similarly, a part of a region in which selection gate lines SGL and word lines WL of one memory unit Su are arranged is illustrated. Further, similarly to the first embodiment, processes after forming a tunnel insulating film 11 and a floating gate electrode film 12, forming STI2 which extends in the Y direction and are arranged in the X direction at a predetermined interval in a semiconductor substrate 1, and forming an inter-electrode insulating film 13 and a control gate electrode film 14 made of Si on the semiconductor substrate 1 will be described.

Figure 6A:
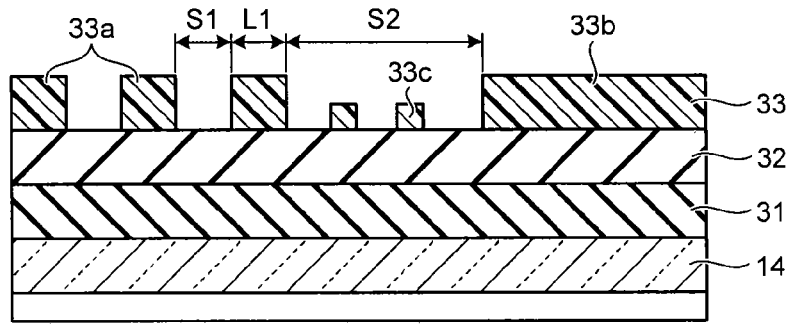
FIGS. 6A to 6E are partial cross-sectional views schematically illustrating an example of a pattern forming method according to a third embodiment.

As illustrated in FIG. 6A, a core film 31 and a mask film 32 are sequentially stacked on the entire surface of the processing object (control gate electrode film 14). A TEOS film may be used as the core film 31 and a SiN film may be used as the mask film 32. Further, a resist is applied on the mask film 32 and using the lithography technique, a resist pattern 33 is formed to be patterned so as to have a line and space shaped pattern (periodic pattern) 33a in which line patterns extending in an X direction are arranged in a Y direction at a predetermined interval and an independent pattern (non-periodic pattern) 33b that is adjacent to the end in the Y direction of the periodic pattern 33a. Here, an auxiliary resolution pattern 33c in which patterns may be resolved to some extent is formed between the periodic pattern 33a and the non-periodic pattern 33b. The auxiliary resolution pattern 33c has a function to expand a lithographic margin of the non-periodic pattern 33b. Since the auxiliary resolution pattern 33c is a pattern in which some patterns may be resolved as described above, the height of the auxiliary resolution pattern 33c is smaller than that of the periodic pattern 33a or the non-period pattern 33b.

Figure 7A:
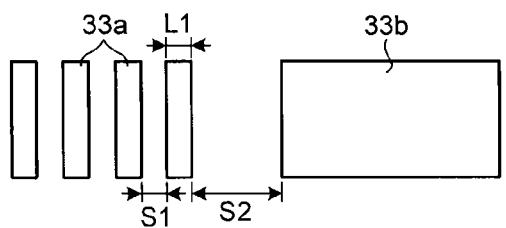
FIGS. 7A to 7D are views illustrating a relationship between a focus margin and a change in an exposure amount when a periodical pattern and a non-periodical pattern are mixed.
Figure 7C:
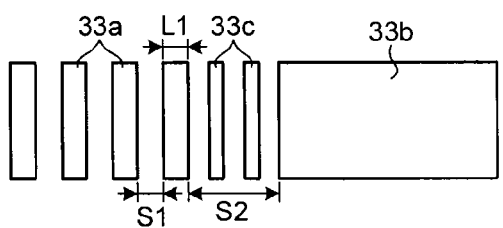
Figure 7B:
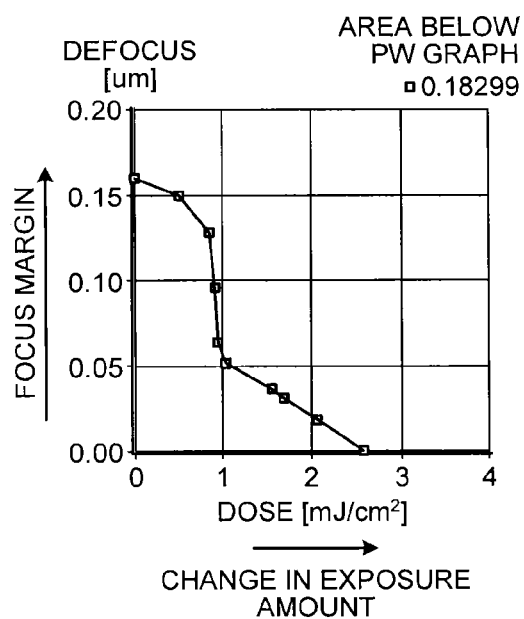
Figure 7D:
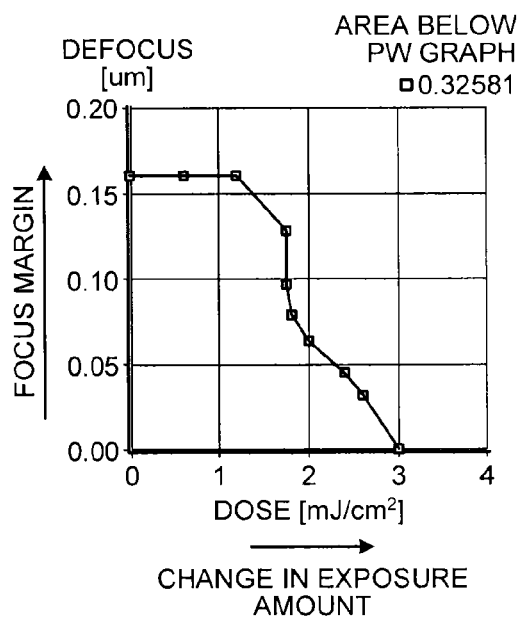

FIGS. 7A to 7D are views illustrating a relationship (Exposure-Defocus Window, hereinafter, referred to as an E-D window) between a focus margin and a change in an exposure amount when a periodical pattern and a non-periodical pattern are mixed. FIG. 7A is a top view when the periodic pattern 33*a* and the non-periodic pattern 33*b* are arranged as described in the first and second embodiments. FIG. 7B is a view illustrating an E-D window of FIG. 7A. Further, FIG. 7C is a top view when the periodic pattern 33*a*, the non-periodic pattern 33*b*, and the auxiliary resolution pattern 33*c* of the third embodiment are arranged and FIG. 7D is a view illustrating an E-D window of FIG. 7C. In the E-D windows of FIGS. 7B and 7D, a horizontal axis represents a change in an exposure amount and a vertical axis represents a focus margin. The curves drawn in the drawings represent the combination of the change in an exposure amount and the focus margin from which the pattern illustrated in FIGS. 7A and 7C is obtained. Therefore, the inner region (lower side) of the curve indicates that a pattern illustrated in FIGS. 7A and 7C is obtained. Further, as illustrated in FIG. 7, if the auxiliary resolution pattern 33*c* is provided as described in the third embodiment, the lithographic margin may be further expanded as compared with the first and second embodiments. Further, in this embodiment, even though it is illustrated that two auxiliary resolution patterns 33*c* are provided, the number is not limited as long as the lithographic margin of the pattern is expanded. Further, by providing the appropriate auxiliary resolution pattern 33*c*, a ratio of the space S1 between the line patterns in the periodic pattern 33*a* and the space S2 between the periodic pattern 33*a* and the non-periodic pattern 33*b* may be appropriately adjusted.

Figure 6B:
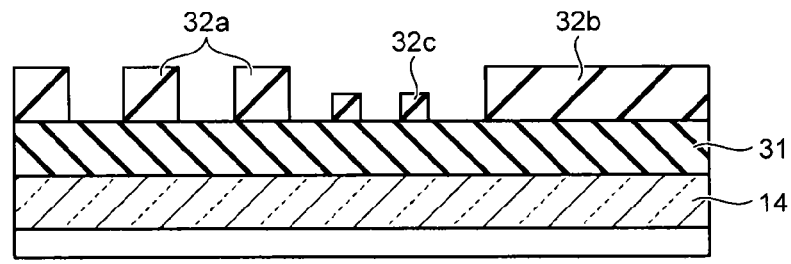

Thereafter, as illustrated in FIG. 6B, the mask film is processed using the resist pattern 33 as a mask by the anisotropic etching such as the RIE method and the resist pattern 33 is transferred. By doing this, in the mask film 32, a periodic pattern 32*a* in which line patterns having a width of L1 in the Y direction are arranged in the space S1 in the Y direction, a non-periodic pattern 32*b* formed to be spaced apart from the end in the Y direction of the periodic pattern 32*a* with a space S2 therebetween, and the auxiliary resolution pattern 32*c* between the periodic pattern 32*a* and the non-periodic pattern 32*b* are formed. The height of the auxiliary resolution pattern 33*c* in the resist pattern 33 is smaller than that of the periodic pattern 33*a* and the non-periodic pattern 33*b*. Therefore, when the mask film 32 is etched, the auxiliary resolution pattern 33*c* is dissipated (removed) faster than the periodic pattern 33*a* and the non-periodic pattern 33*b*. Accordingly, a predetermined amount of a mask film 32 in a forming position of the auxiliary resolution pattern 33*c* is removed until the etching of the mask film 32 by the periodic pattern 33*a* and the non-periodic pattern 33*b* is completed. As a result, the height of the auxiliary pattern 32*c* which is transferred onto the mask film 32 is smaller than that of the periodic pattern 32*a* and the non-periodic pattern 32*b*. After completing the processing, the resist pattern 33 is removed by the resist stripping technique.

Figure 6C:
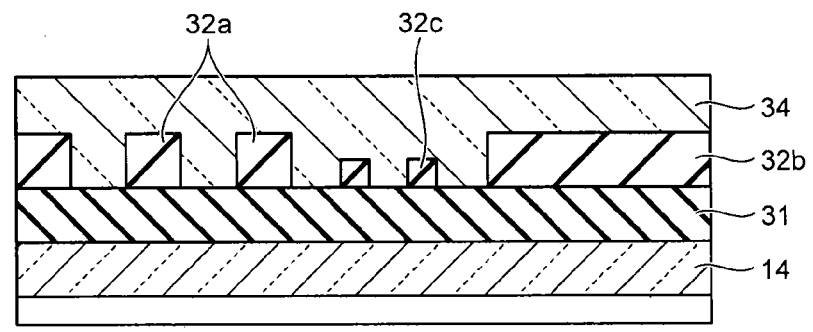
Figure 6D:
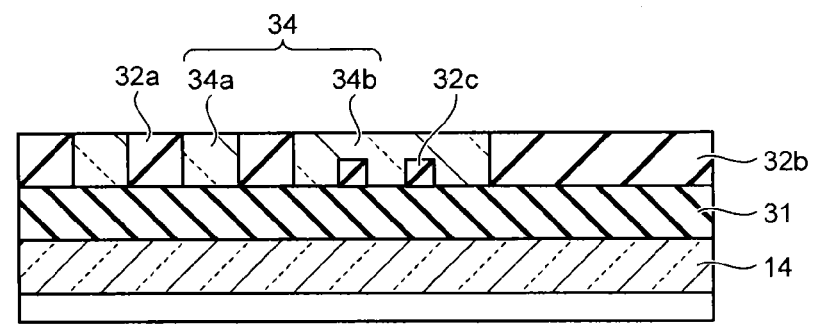

Next, as illustrated in FIG. 6C, an inversion layer 34 is formed on the entire surface of the processing object so as to be higher than the top surface of the mask film 32. Si may be used as the inversion film 34. Thereafter, as illustrated in FIG. 6D, the entire surface of the inversion layer 34 is etched until the top surface of the mask film 32 is exposed. By doing this, the inversion layer 34 becomes a periodic pattern 34*a* formed in a region of the space S1 of the periodic pattern 32*a* and a non-periodic pattern 34*b* formed in a region of the space S2. Further, even though the auxiliary pattern 32*c* is present in the non-periodic pattern 34*b*, as described above, the height of the auxiliary pattern 32*c* is smaller than the height of the periodic pattern 32*a* and the non-periodic pattern 32*b*. Therefore, the top surface of the auxiliary pattern 32*c* is not exposed.

Figure 6E:
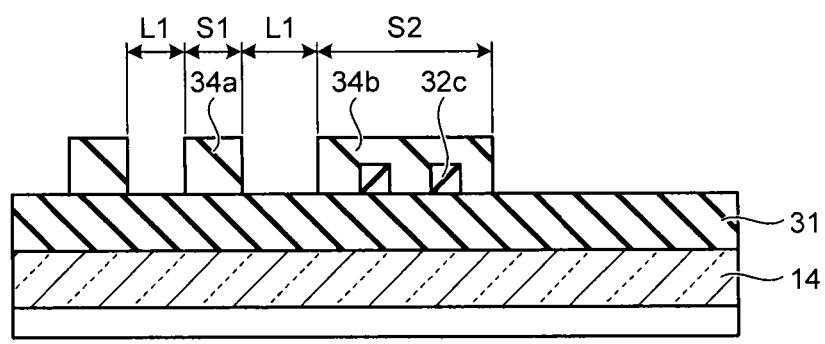

Further, as illustrated in FIG. 6E, the mask film 32 is selectively removed by etching. By doing this, a periodic pattern 34*a* and a non-periodic pattern 34*b* formed of the inversion layer 34 are formed in the position of the space S1 in the periodic pattern 33*a* formed in FIG. 6A and the position of the space S2 between the periodic pattern 33*a* and the non-periodic pattern 33*b*. The width in the Y direction of the line pattern that forms the periodic pattern 34*a* is substantially equal to S1 and the width of the space is substantially equal to L1. Further, the width in the Y direction of the non-periodic pattern 34*b* is substantially equal to S2 and the interval between the non-periodic pattern 34*b* and the periodic pattern 34*a* is substantially L1. Further, also in the third embodiment, without using the mask film 32 on the core film 31, the resist pattern 33 may be formed so as to arrange the auxiliary resolution pattern 33*c* between the periodic pattern 33*a* and the non-periodic pattern 33*b*. Thereafter, by the same procedures as illustrated in FIGS. 6C to 6E, the periodic pattern 34*a* and the non-periodic pattern 34*b* formed of the inversion layer 34 may be formed in the positions of the spaces S1 and S2 in the resist pattern 33.

Thereafter, the processes subsequent to FIG. 4F described in the first embodiment or the processes subsequent to FIG. 5B described in the second embodiment are performed to form a NAND type flash memory device in which word lines WL having a line width which is substantially half of the space S1 of FIG. 6A are periodically arranged in a space S3 having a width which is substantially half of the width L1 of the line pattern in the periodic pattern 33*a* of FIG. 6A in the Y direction, the space between the word line WL and the selection gate line SGL is significantly smaller than the space S2, and a space S4 has a width which is substantially approximate to the width of the space S3.

In the third embodiment, when the periodic pattern 33*a* and the non-periodic pattern 33*b* are exposed and developed in the resist by the lithography technique, an auxiliary resolution pattern 33*c* which may be resolved less than the periodic pattern 33*a* and the non-periodic pattern 33*b* is formed between the periodic pattern 33*a* and the non-periodic pattern 33*b*. By doing this, in addition to the effects of the first and second embodiments, it is possible to sufficiently secure the lithographic margin when the periodic pattern 33*a* and the non-periodic pattern 33*b* are formed.

Further, by forming the auxiliary resolution pattern 33*c*, the ratio of the space S1 in the periodic pattern 33*a* and the space S2 between the periodic pattern 33*a* and the non-periodic pattern 33*b* which is fixed in the related art may be arbitrarily changed. As a result, it is possible to form the non-periodic pattern 33*b* for forming a selection gate line having a smaller width in the Y direction than that of the related art.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method, comprising:
forming a pattern in which a first pattern in which a plurality of first line patterns extending in a first direction are arranged in a second direction orthogonal to the first direction and a second pattern arranged so as to be spaced apart from an end in the second direction of the first pattern with a space at a predetermined interval therebetween are mixed above a processing object;
forming an inversion pattern having a periodic pattern in which the first line patterns of the first pattern and spaces therebetween are inverted and a non-periodic pattern arranged at an interval which is substantially equal to a width of the first line patterns from an end in the second direction of the periodic pattern so as to correspond to the spaces between the first line patterns in the first pattern and the space between the first pattern and the second pattern respectively above the processing object;
conformally forming a sidewall film above the processing object above which the inversion pattern is formed;
etching back the sidewall film so as to expose a top surface of the inversion pattern;
selectively removing the periodic pattern of the inversion pattern whose top surface is exposed to form a sidewall pattern formed of the sidewall film above the processing object; and
etching the processing object using the sidewall pattern and the non-periodic pattern surrounded by the sidewall film as masks.

2. The pattern forming method according to claim 1, wherein
in the forming of the pattern, the first pattern has the first line patterns which are arranged in parallel at a first interval in the second direction and the second pattern is arranged at an interval larger than the first interval from the end of the second direction of the first pattern, and
in the forming of the inversion pattern, the periodic pattern has second line patterns having a width which is substantially equal to the first interval which are arranged at an interval which is substantially equal to the width of the first line patterns, the non-periodic pattern has a width which is larger than the first interval and are arranged at an interval which is substantially equal to the width of the first line patterns from the end of the second direction of the periodic pattern.

3. The pattern forming method according to claim 2, wherein
in the forming of the pattern, the pattern in which the first pattern and the second pattern are mixed is formed through a core film above the processing object, and
the forming the inversion pattern includes:
forming an inversion layer above the pattern in which the first pattern and the second pattern are mixed and the core film;
etching the inversion layer until top surfaces of the first pattern and the second pattern are exposed;
removing the exposed first pattern and second pattern to form a pattern of the inversion layer in the spaces between the first line patterns and the space between the first pattern and the second pattern; and
etching the core film using the pattern of the inversion layer as a mask to form the inversion pattern formed of the core film.

4. The pattern forming method according to claim 3, after the forming the inversion pattern and before the forming the sidewall film further comprising:
slimming the pattern of the core film so as to adjust a width of the pattern of the core film formed to correspond to positions of the spaces between the first line patterns to be substantially half of the first interval; and
wherein in the forming of the sidewall film, the sidewall film having a thickness which is substantially half of the first interval above the processing object above which the slimmed inversion pattern is formed is formed.

5. The pattern forming method according to claim 3, wherein
in the forming of the pattern, an auxiliary pattern having a height smaller than a height of the first pattern and the second pattern is formed in the space between the first pattern and the second pattern; and
in the forming of the inversion pattern, the auxiliary pattern is embedded by the etched inversion layer.

6. The pattern forming method according to claim 5, wherein in the forming of the pattern, a plurality of auxiliary patterns are provided such that a ratio of the space between the first pattern and the second pattern and the spaces between the first line patterns in the first pattern has a predetermined value.

7. The pattern forming method according to claim 1, further comprising performing a loop-cut processing, after the etching of the processing object, on a loop shaped processing object of which both ends in the first direction are connected.

8. The pattern forming method according to claim 3, wherein
in the forming of the inversion pattern, a first resist pattern is formed above the core film so as to cover a region in which the second pattern is removed after forming the pattern of the inversion layer, and the core film is etched using the pattern of the inversion layer and the first resist pattern as masks to form the non-periodic pattern so as to correspond to the space between the first pattern and the second pattern and the region, and
the method further comprising:
forming, after the etching of the processing object, a second resist pattern so as to expose the region in which the first resist pattern is formed when the inversion pattern is formed among some parts of the processing object onto which the non-periodic pattern is transferred; and
etching the parts of the processing object onto which the non-periodic pattern is transferred using the second resist pattern as a mask so as to have a predetermined width.

9. The pattern forming method according to claim 8, wherein
in the forming of the second resist pattern, the second resist pattern is formed so as to further expose both ends of the first direction among some parts of the processing object onto which the sidewall pattern is transferred, and
the etching of the parts of the processing object includes performing the loop-cut processing on a loop shaped portion of the processing object onto which the sidewall pattern is transferred using the second resist pattern as a mask.

10. The pattern forming method according to claim 3, wherein
the core film is made of a silicon oxide film,
the pattern is made of a silicon nitride film, and
the inversion layer is made of a silicon film.

11. A pattern forming method of a wiring line that includes word lines that configure a non-volatile semiconductor memory device, extend in a first direction and are arranged in a second direction orthogonal to the first direction at a predetermined interval and selection gate lines that configure the non-volatile semiconductor memory device and are arranged to be adjacent to word lines at an end in the second direction among the predetermined number of arranged word lines and parallel to the word lines, comprising:

forming a pattern in which a first pattern in which a plurality of first line patterns extending in the first direction are arranged in the second direction and a second pattern arranged so as to be spaced apart from an end in the second direction of the first pattern with a space at a predetermined interval therebetween are mixed above a processing object that configures the word lines and the selection gate lines;

forming an inversion pattern having a periodic pattern in which the first line patterns of the first pattern and spaces therebetween are inverted and a non-periodic pattern arranged at an interval which is substantially equal to a width of the first line patterns from an end in the second direction of the periodic pattern so as to correspond to the spaces between the first line patterns in the first pattern and the space between the first pattern and the second pattern respectively above the processing object;

conformally forming a sidewall film above the processing object above which the inversion pattern is formed;

etching back the sidewall film so as to expose a top surface of the inversion pattern;

selectively removing the periodic pattern of the inversion pattern whose top surface is exposed to form a sidewall pattern formed of the sidewall film above the processing object; and etching the processing object so as to transfer the sidewall pattern and the non-periodic pattern surrounded by the sidewall film.

12. The pattern forming method according to claim 11, wherein in the forming of the pattern, the first pattern has the first line patterns which are arranged in parallel at a first interval in the second direction and the second pattern is arranged at an interval larger than the first interval from the end of the second direction of the first pattern, and in the forming of the inversion pattern, the periodic pattern has second line patterns having a width which is substantially equal to the first interval which are arranged at an interval which is substantially equal to the width of the first line patterns, the non-periodic pattern has a width which is larger than the first interval and are arranged at an interval which is substantially equal to the width of the first line patterns from the end of the second direction of the periodic pattern.

13. The pattern forming method according to claim 12, wherein in the forming of the pattern, the pattern in which the first pattern and the second pattern are mixed is formed through a core film above the processing object, the forming the inversion pattern includes:
forming an inversion layer above the pattern in which the first pattern and the second pattern are mixed and the core film;
etching the inversion layer until top surfaces of the first pattern and the second pattern are exposed;
removing the exposed first pattern and second pattern to form a pattern of the inversion layer in the spaces between the first line patterns and the space between the first pattern and the second pattern; and
etching the core film using the pattern of the inversion layer as a mask to form the inversion pattern formed of the core film.

14. The pattern forming method according to claim 13, after the forming the inversion pattern and before the forming the sidewall film further comprising:
slimming the pattern of the core film so as to adjust a width of the pattern of the core film formed to correspond to positions of the spaces between the first line patterns to be substantially half of the first interval; and
wherein in the forming of the sidewall film, the sidewall film having a thickness which is substantially half of the first interval above the processing object above which the slimmed inversion pattern is formed is formed.

15. The pattern forming method according to claim 13, wherein
in the forming of the pattern, an auxiliary pattern having a height smaller than a height of the first pattern and the second pattern is formed in the space between the first pattern and the second pattern, and
in the forming of the inversion pattern, the auxiliary pattern is embedded by the etched inversion layer.

16. The pattern forming method according to claim 15, wherein in the forming of the pattern, a plurality of auxiliary patterns are provides such that a ratio of the space between the first pattern and the second pattern and the spaces between the first line patterns in the first pattern has a predetermined value.

17. The pattern forming method according to claim 11, further comprising performing a loop-cut processing, after the etching the processing object, on a loop shaped processing object of which both ends in the first direction are connected.

18. The pattern forming method according to claim 13, wherein
in the forming of the inversion pattern, a first resist pattern is formed above the core film so as to cover a region in which the second pattern is removed after forming the pattern of the inversion layer, and the core film is etched using the pattern of the inversion layer and the first resist pattern as masks to form the non-periodic pattern so as to correspond to the space between the first pattern and the second pattern and the region, and the method further comprising:
forming, after the etching of the processing object, a second resist pattern so as to expose the region in which the first resist pattern is formed when the inversion pattern is formed among some parts of the processing object onto which the non-periodic pattern is transferred; and
etching the parts of the processing object onto which the non-periodic pattern is transferred using the second resist pattern as a mask so as to have a predetermined width of the selection gate lines.

19. The pattern forming method according to claim 18, wherein
in the forming of the second resist pattern, the second resist pattern is formed so as to further expose both ends of the first direction among some parts of the processing object onto which the sidewall pattern is transferred, and
the etching of the parts of the processing object includes performing the loop-cut processing on a loop shaped portion of the processing object onto which the sidewall pattern is transferred using the second resist pattern as a mask.

20. The pattern forming method according to claim 11, further comprising:
forming, before the forming the pattern in which the first pattern and the second pattern are mixed, a tunnel insulating film and a floating gate electrode film above a semiconductor substrate;

forming trenches arranged at a predetermined interval in the first direction and extending in the second direction, the trenches reaching the semiconductor substrate from the floating gate electrode film;

embedding an element isolation insulating film in the trenches;

forming an inter-electrode insulating film above the element isolation insulating film and the floating gate electrode film, forming an opening that passes through the inter-electrode insulating film in a forming region of the selection gate lines; and forming a control gate electrode film which serves as the processing object above the inter-electrode insulating film having the opening formed therein.

* * * * *